United States Patent
Ohashi

(10) Patent No.: US 6,805,563 B2
(45) Date of Patent: Oct. 19, 2004

(54) SOCKET FOR ELECTRICAL PARTS

(75) Inventor: Yoshiyuki Ohashi, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 10/655,048

(22) Filed: Sep. 5, 2003

(65) Prior Publication Data

US 2004/0048502 A1 Mar. 11, 2004

(30) Foreign Application Priority Data

Sep. 10, 2002 (JP) .................................... 2002-263971

(51) Int. Cl.$^7$ ............................................... H01R 12/00
(52) U.S. Cl. ............................. 439/73; 439/67; 439/86; 439/493; 439/331
(58) Field of Search .......................... 439/67, 77, 493, 439/86, 331, 73, 66, 586

(56) References Cited

U.S. PATENT DOCUMENTS

| | | | | |
|---|---|---|---|---|
| 5,059,129 A | * | 10/1991 | Brodsky et al. | ............... 439/67 |
| 5,099,393 A | * | 3/1992 | Bentlage et al. | ............... 439/67 |
| 5,801,728 A | * | 9/1998 | Yanagi et al. | .................. 439/67 |
| 5,873,740 A | * | 2/1999 | Alcoe et al. | .................. 439/67 |
| 5,947,750 A | * | 9/1999 | Alcoe et al. | .................. 439/67 |
| 6,536,872 B2 | * | 3/2003 | Goin et al. | .................... 439/67 |

FOREIGN PATENT DOCUMENTS

JP       11-242977       9/1999

* cited by examiner

Primary Examiner—Tho D. Ta
(74) Attorney, Agent, or Firm—Staas & Halsey LLP

(57) ABSTRACT

A socket for electrical parts comprising a base member, an elastic member disposed on the base member, and a base plate, in the form of deformable sheet, disposed on the elastic member, and provided with a plurality of contact points to which a plurality of terminals of an electrical part is to be contacted, disposed on the upper surface of the base plate in a predetermined distance. When a position corresponding to each contact point of the elastic member is compressed by the pressing force from the terminal of the electrical part, an escaping space is provided for elastic deformation portion pushed away by the compression and is disposed at a position corresponding in between each terminal.

9 Claims, 6 Drawing Sheets

PRIOR ART

SOCKET FOR ELECTRICAL PARTS

BACKGROUND OF THE INVENTION

1. Field of the Invention

The present invention relates to a socket for electrical parts for detachably holding and accommodating electrical parts such as a semiconductor device (which is called herein as an "IC package") or the like, to conduct electrical performance test and examination of the electrical parts, and more particularly, making improvements in the contact stability between the socket for electrical parts and the electrical part.

2. Prior Art of the Invention

In a known art, there has been provided an IC socket, as "socket for an electrical part" for detachably holding and accommodating an IC package as an "electrical part".

Such IC package includes BGA (Ball Grid Array) type, in which a number of spherical solder balls (terminals) are arranged to the lower surface of the rectangular package body projecting downward in a matrix arrangement.

On the other hand, aforementioned IC package is positioned to be accommodated on the accommodation surface portion of a socket body of the IC socket at a predetermined position, and the solder balls of this IC package each make contact with the contact point of a tab film, a sheet like base plate to establish electrical connection when the performance test of such IC package is being conducted.

Further more, an elastic member is provided on the lower surface of the tab film to prevent the solder balls from being damaged and to enhance the contact stability between the solder ball and the contact point of the tab film. (Please refer to the Japanese laid open patent publication No. Hei 11-242977)

FIG. 10 is a sectional view showing a contact state of the solder ball 2a of the IC package 2 accommodated on the accommodation surface portion of the IC socket and the tab film 5 in a conventional IC socket. The tab film 5 is formed with a contact point 5a to which solder ball 2a contacts at a position corresponding to the solder ball 2a. To the lower side of the tab film 5, an elastic member 4, a plate shape body having elasticity made of silicon rubber is disposed.

In such IC socket, after the IC package 2 is mounted on the tab film 5, the package body 2b is pressed downward the amount as prescribed, accordingly the elastic member 4 is elastically deformed through the solder ball 2a and the tab film 5. By reaction force from this elastic deformation, a predetermined contacting pressure is produced between the solder ball 2a and the contact point 5a on the tab film 5, to ensure electrical contact between the solder ball 2a and the contact point 5a.

However, in the conventional structure of such IC socket, the projection amount (height) from the lower surface of the package body 2b to the lowermost point of each solder ball 2a happens to vary with in the range of n μm to 10 nμm (n:1–9 integer) due to the curving of the package body 2b, due to the difference in the diameter of the solder ball 2a, and due to the variation occurring when mounting the solder ball 2a to the package body 2b or the like.

When IC package 2 having such variation in the projection amount of the solder ball 2a is to be mounted on to the conventional IC socket, solder balls 2a each having approximately same amount of projection from the lower surface of the package body 2b to the lower most point of the solder ball 2a, establish electrical contact with the contact points 5a of the tab film 5 at a predetermined contacting pressure as shown in FIG. 10, respectively, by pushing the package body 2b downward the amount as prescribed. At this time, the elastic member 4 is elastically deformed predetermined amount through the solder ball 2a and the tab film 5.

In this state, the elastic member 4 is formed to have a plate like body (one sheet with plane surface). And in the vicinity of the contact point 5b of the tab film 5 corresponding to the solder ball 2c having smaller projection amount from the package body 2b than that of the solder ball 2a, the elastic member 4 is pressed downward (elastically deformed) as shown in FIG. 10 by the solder ball 2a adjacent to the solder ball 2c, unable to make contact between the solder ball 2c and the contact point 5b. Or else, even if the solder ball 2c and the contact point 5b are able to be contacted, the elastic member 4 is unable to be pressed (elastically deformed) the amount prescribed therefore stability of the electrical contact between the solder ball 2c and the contact point 5b can not be maintained.

In order to ensure electrical contact even in the IC package 2 having solder ball 2c with small amount of projection, it is necessary to make larger the pushing amount for pressing downward the IC package 2 in response to the solder ball 2c with small amount of projection. In this, operating force of the member for pressing downward the IC package may become larger and the solder ball 2a with large amount of projection may be damaged and destroyed.

SUMMARY OF THE INVENTION

An object of the present invention is to substantially eliminate defects or drawbacks encountered in the related art mentioned above and to provide a socket for electrical parts capable of maintaining the contact stability even when there is a variation in the amount of the downward projection of the solder ball (terminal) of the IC package, and reducing the operating force toward the member for pressing downward the IC package and, preventing the solder ball from being damaged and destroyed.

This and other objects can be achieved according to the present invention by providing a socket for electrical parts comprising;

a base member;

an elastic member disposed on the base member; and a base plate, in the form of deformable sheet, disposed on the elastic member, and provided with a plurality of contact points to which a plurality of terminals of an electrical part is to be contacted, disposed on the upper surface of the base plate in a predetermined distance;

when a position corresponding to each contact point of the elastic member is compressed by the pressing force from the terminal of the electrical part, an escaping space is provided for elastic deformation portion pushed away by the compression and is disposed at a position corresponding in between each terminal.

Another aspect of the present invention is characterized by that the elastic member is formed with a protrusion projecting toward the base plate at a position corresponding to each contact point, and in between such protrusions, the escaping space is formed.

Still another aspect of the present invention is characterized by that the elastic member is formed with a protrusion projecting toward the base member at a position corresponding to each contact point, and in between such protrusions, the escaping space is formed.

Another aspect of the present invention is characterized by that the base member is formed with a protrusion projecting toward the elastic member at a position corresponding to each contact point, and in between such protrusions, the escaping space is formed.

According to the present invention of the characteristics and structures mentioned above, when the position corresponding to each contact point of the elastic member is compressed by the pressing force from the terminal of the electrical part, an escaping space is provided for the elastic deformation portion which is pushed away by the compression to be escaped at a position corresponding to a position in between each terminal, so that the portion corresponding to the terminal of the elastic member can be elastically deformed independently without being affected by the surrounding deformation. Accordingly, this portion corresponding to the terminal will also be deformed following the deformation of the terminal and the base plate even when there is a variation in the projection amount of the terminal, thereby ensuring the contact stability and preventing the contact pressure of the terminals from varying, and also preventing the terminal from being deformed or destroyed by excessive pressure.

Furthermore, an elastic member is formed with a protrusion at a position corresponding to each contact point and an escaping space is formed in between each protrusion. Therefore, compared to the conventional one, region (protrusion) where the terminals are to be contacted can be easily deformed so that the operating force against the cover member for applying predetermined contact pressure between the terminal and the contact point can be reduced.

Still furthermore, a base member is formed with a protrusion projecting toward the elastic member at a position corresponding to each contact point and an escaping space is formed in between each protrusion so that protrusion can be easily formed in the base member having predetermined strength.

BRIEF DESCRIPTION OF THE DRAWINGS

FIG. 2A is a front view of an IC package; FIG. 2B is a bottom view thereof;

DESCRIPTION OF THE PREFERRED EMBODIMENTS

Figure 1:
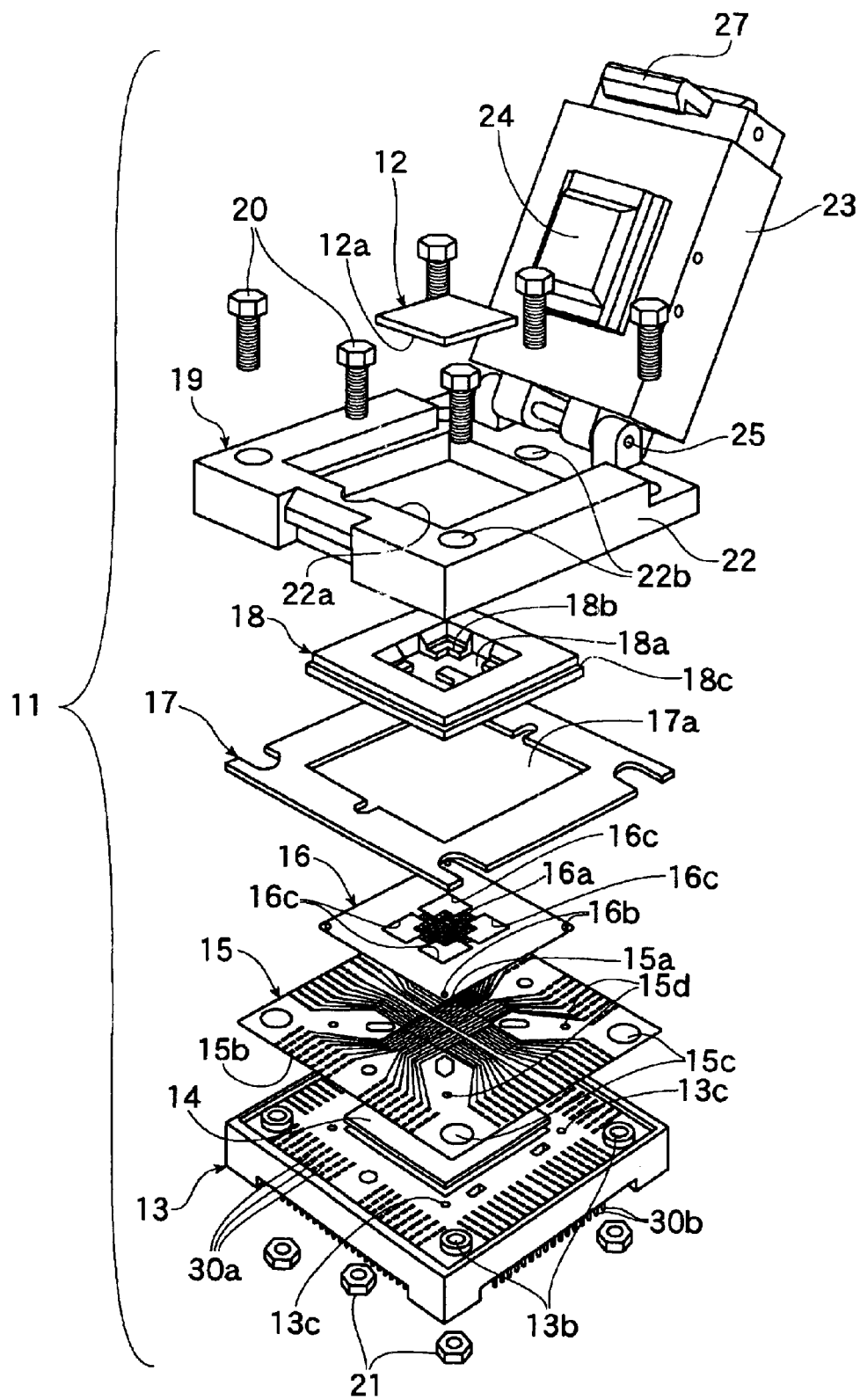
FIG. 1 is a perspective view of an IC socket according to the first embodiment of the present invention.

Preferred embodiments of the present invention will be described hereunder with reference to the accompanying drawings.

First Embodiment

FIGS. 1 to 5 represent the first embodiment of the present invention.

With reference to these figures, reference numeral 11 denotes an IC socket as "socket for electrical part", and the IC socket is disposed on the printed circuit board, not shown, and by holding the IC package 12 to the IC socket 11, IC package 12 and the printed circuit board are to be electrically connected.

Further, it is first to be noted that terms "upper", "lower", "right", "left" or like are used herein with reference to the illustrated state or in a generally using state of the socket.

Figure 2A:
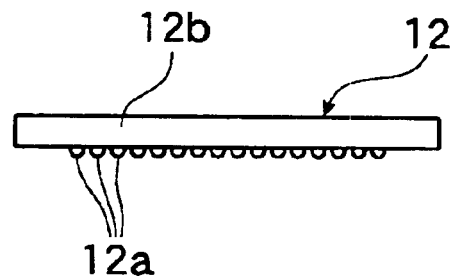
FIG. 2A and FIG. 2B are illustrations of an IC package according to the first embodiment.
Figure 2B:
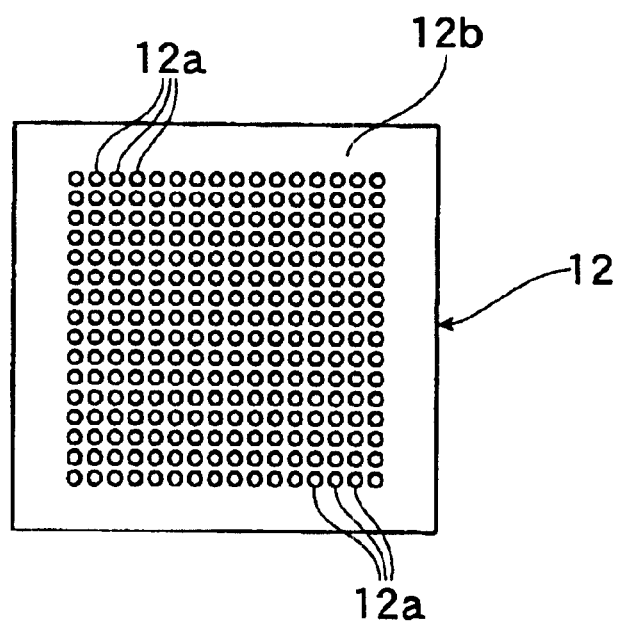

IC package 12 is of so-called a BGA (Ball Grid Array) type, as shown in FIGS. 2A and 2B, which has a rectangular package body 12b and a number of approximately spherical solder balls 12a is extended downward from a lower surface of the IC package body 12b in matrix arrangement having vertical and horizontal rows.

On the other hand, IC socket 11 is provided with, as shown in FIG. 1 or the like, in order from the bottom, a base plate 13 as a "base member", elastic member 14, tab film 15 as a "base plate", stopper 16 for positioning the IC package 12, springy member 17, alignment plate 18 and pressing jig 19. All of the above structures are attached to or detached from, by the bolt 20 and the nut 21.

The base plate 13 has a quadrilateral sheet-like shape and is provided with, as shown in FIG. 1, a number of contact pins 30 in four rows disposed to four sides of the peripheral portion, a number of bolt holes 13b, positioning holes 13c and also an elastic member 14 having springy property and good heat resisting property made of quadrilateral sheet like silicon rubber at the center portion thereof.

Figure 4:
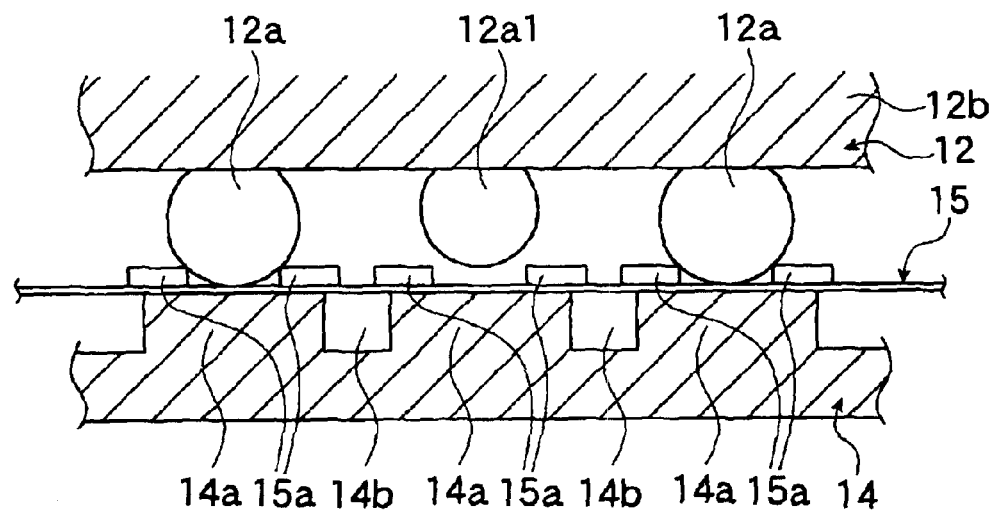
FIG. 4 is a sectional view showing a state of the solder ball of the IC package accommodated to the IC socket, before being pressed by the tab film, according to the first embodiment; an illustration of a stopper is omitted.

An elastic member 14 is formed with, as shown in FIG. 4, a protrusion 14a projecting toward the tab film 15 at a position corresponding to each contact point 15a of the tab film 15. In between each adjacent protrusion 14a, there is formed an escaping space 14b. Such protrusion 14a is in a circular form in a plane dimension (view) and the tab film 15 is to be mounted on the upper surface of the protrusion 14a. Further, an escaping space 14b is disposed at a position corresponding between each contact point 15a of the tab film 15, and when the position (the protrusion 14a) corresponding to each contact point 15a of the elastic member 14 is compressed by the pressing force from the solder ball 12a, elastic deformation portion 14c is pushed away by this compression and the elastic deformation portion 14c can be deformed and displaced toward the escaping space 14b.

The escaping space 14b is formed by laser processing a silicon rubber and an elastic member 14 having an escaping space 14b can also be die formed.

Further, when the protrusion 14a is compressed, the elastic deformation portion 14c pushed away by this compression is deformed toward the escaping space 14b, and this escaping space 14b is formed to have a pitch, width, depth or the like in which deformation of each protrusion 14a will not affect the other adjacent protrusion 14a. The elastic force of such elastic member 14 can ensure electrical connection between the IC package 12 and the tab film 15.

Furthermore, the elastic member 14 is disposed at the center portion of the base plate 13 and it is disposed at a place corresponding to the depressed area of the tab film 15 to which the arrangement of the solder ball 12a of the IC package 12 is pressed.

Figure 3:
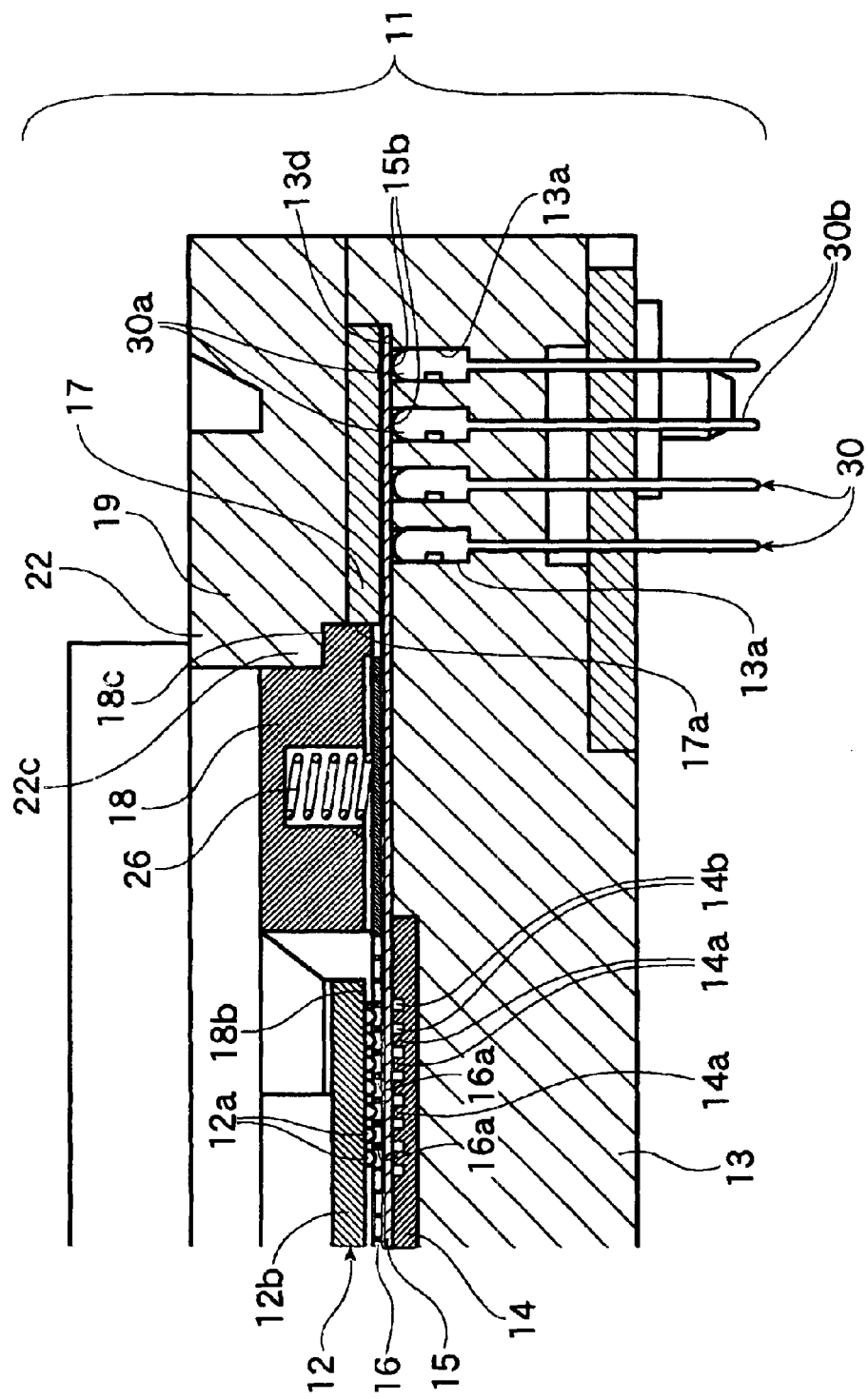
FIG. 3 is a sectional view of an IC socket showing an opened state of the cover member in which IC package is accommodated to the IC socket of the first embodiment of FIG. 1.

On the other hand, contact pin 30 is formed by press processing a plate material made of metal having electrical conductivity, and as shown in FIG. 3, it is press fitted into the through hole 13a of the base plate 13 to make contact between the upper end portion of the contact portion 30a and the connecting electrode 15b of the tab film 15.

More over, a lead portion 30b is formed to the lower end portion of the contact pin 30 and this lead portion 30b is inserted into the locate board, not shown, and then into the through hole of the printed circuit board, thereby realizing electrical connection.

Further more, the tab film 15, as shown in FIG. 1 and FIG. 3, is a base plate having a quadrangular shape slightly smaller than the base plate 13, and is formed as a thin deformable this sheet inside the recess portion 13d formed on the upper surface portion of the base plate 13. The center portion of the upper surface is the accommodation surface for accommodating the IC package 12.

And such tab film 15, as shown in FIG. 1, is provided with a plurality of contact points 15a (electrode pattern) conjugated to the arrangement of the solder ball 12a of the IC package 12 at the center portion of one surface (front surface) on the side of the IC package 12, and a connecting electrode 15b conjugated to the base plate 13 at a peripheral portion of the other surface (back surface) on the side of the base plate 13, connecting therebetween with a conductive wire. Moreover, the tab film 15 is formed with the bolt hole 15c and the positioning hole 15d similar to that of the base plate 13 in position and in size.

Furthermore, a stopper 16, as shown in FIG. 1 and FIG. 3, is formed to be a quadrangular sheet-like shape made of polymide resin having heat resistance, insulating property and predetermined hardness. To the center portion of the stopper 16, there is formed a plurality of solder ball openings 16a in which a number of solder balls 12a of the IC package 12 is to be inserted and to the four areas (points) surrounding these solder ball openings 16a, there is formed a communicating opening 16c. And at the four corners of the stopper 16, the positioning hole 16b is formed having a position and size similar to that of the positioning hole 15d of the tab film 15.

And such stopper 16 is structured to have a thickness slightly smaller than the height of the solder ball 12a and it is disposed in between the lower surface of the package body 12b and the upper surface (accommodation surface) of the tab film 15, preventing the solder ball 12a from being damaged or destroyed not more than the predetermined amount. And the size of the solder ball opening 16a positions the side surface portion of the inserted solder ball 12a. And at the same time, the solder ball opening 16a is formed to be somewhat larger than the diameter of the solder ball 12a so that the solder ball 12a can be inserted into the solder ball opening 16a even when there is somewhat dimensional difference in the formation (molding) or the like.

Furthermore, the springy member 17, as shown in FIG. 1 and FIG. 3, is formed to have a quadrangular frame shape made of silicon rubber sheet. Inside the springy member 17, an opening 17a for accommodating the alignment plate 18 is provided, and as shown in FIG. 3, the springy member 17 is disposed at a recess portion 13d of the base plate 13. In between the front surface portion to which the connecting electrode 15b of the tab film 15 are provided and the pressing jig body 22 having a frame shape, to be described herein later, the springy member 17 is disposed to be elastically deformed predetermined amount in a vertical direction (thickness direction).

Pressing jig 19 is provided with, as shown in FIG. 1, the pressing jig body 22 having a quadrangular frame shape, and the cover member 23 is rotatably attached to the pressing jig body 22 by axis 25. This cover member 23 is urged by the spring, not shown, in the opening direction. The cover member 23 is provided with a pusher member 24 inside the recess portion to be vertically moveable under the closed state of the cover member 23, and it is urged downward to the direction away from the cover member 23 by a plurality of spring, not shown. Moreover, the cover member 23 is provided with a rotatable latch member 27 at its front end portion to be engaged and to be disengaged to the pressing jig body 22.

The pressing jig body 22 is formed with an inner side opening 22a to which alignment plate 18 is accommodated, to be described herein later, inside the frame shape and a plurality of bolt holes 22b to which bolt 20 are to be inserted.

Inside the inner side opening 22a, the alignment plate 18 is disposed to be detachable (please refer to FIG. 3). This alignment plate 18 in a form of frame shape, as shown in FIG. 1, positions the outer peripheral surface of the package body 12b of the IC package 12 on the inner side opening portion 18a and also the alignment plate 18 is to be accommodated at the receiving portion 18b under a state when the peripheral portion of the IC package 12 is being supported as shown in FIG. 3. This receiving portion 18b is to be inserted into the through hole opening 16c of the stopper 16.

Moreover, the alignment plate 18, as shown in FIG. 3, is urged upward by the spring 26 placed between the stopper 16 and the alignment plate 18. By this urging force, a stepped portion 18c formed to the outer peripheral portion is engaged with the lower inner peripheral portion 22c of the pressing jig body 22 so as to restrict the upward movement.

Further, the alignment plate 18 is provided with a positioning pin, not shown, extending downward from the lower surface portion to be inserted into the positioning hole 16b, 15d and then to be fitted into the positioning hole 13b.

Furthermore, the positioning pin, not shown, of the alignment plate 18 is inserted into each positioning hole 16b, 15d of the stopper 16 and the tab film 15 respectively and then fitted into the positioning hole 13c of the base plate 13 so that each member can be structured in a predetermined positional relationship. And into each bolt hole 13b, 15c, 22b of the base plate 13, the tab film 15 and the pressing jig body 22 respectively, bolt 20 are inserted from above and screwed together with the nut 21 so as to be fixed in a superimposed state.

Above-mentioned IC socket 11 is disposed on the printed circuit board and the IC package 12 is set to the IC socket as described hereunder.

In other words, IC package 12 is mounted on top of the tab film 15 by inserting the IC package 12 into the opening portion 18a of the alignment plate 18 at the opened state of the cover member 23 of the pressing jig 19. In doing so, first, peripheral portion of the package body 12b of the IC package 12 is to be positioned at a predetermined position under the guidance of the alignment plate 18.

Further more, each solder ball 12*a* is to be inserted into each solder ball opening 16*a* of the stopper 16 so that the side surface portion of each solder ball 12*a* is to be positioned by the inner surface of each solder ball opening 16*a*.

Under the opened state of the cover member 23, the alignment plate 18, as shown in FIG. 3, and IC package 12 which is supported by the alignment plate 18 are floating above the stopper 16 so that solder ball 12*a* and the contact point 15*a* of the tab film 15 are not in contact.

Next, when the cover member 23 of the pressing jig body 19 is being closed, upper surface of the IC package 12 is pressed by the pusher member 24, thereby lowering the alignment plate 18 against the urging force of the spring 26 and making contact the solder ball 12*a* of the IC package 12 with the contact point 15*a* of the tab film 15. When the cover member 23 is further being closed from this point, the IC package 12 and the tab film 15 are pressed downward to electrically deform the elastic member 14. By this reaction force of the elastic deformation of the elastic member 14, the contact point 15*a* of the tab film 15 is pressed toward the solder ball 12*a* of the IC package 12 and the contact point 15*a* and the solder ball 12*a* are press contacted to thereby realizing electrical connection therebetween at a predetermined contacting pressure.

In this manner, even in a case where there is a variation in the projection amount of each solder ball 12*a* of the IC package 12, each contact point 15*a* and each solder ball 12*a* can be contacted at predetermined contacting pressure.

Figure 5:
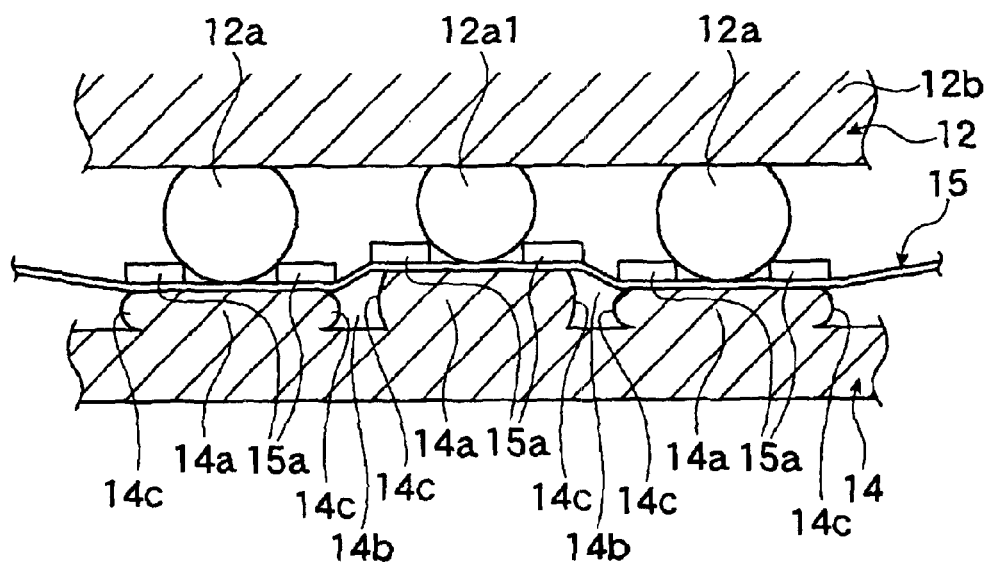
FIG. 5 is a sectional view showing a state of the solder ball of the IC package accommodated to the IC socket, being pressed by the tab film, according to the first embodiment; an illustration of a stopper is omitted.

In other words, as shown in FIG. 4 and FIG. 5, in case where there is a variation in the projection amount of the solder ball 12*a* of the IC package 12 and the IC package 12 having solder ball 12*a*1 with a projection amount smaller than that of the other solder ball is attached, each protrusion 14*a* of the elastic member 14 is to be elastically deformed independently in accordance with the projection amount of each corresponding solder ball 12*a*.

That is, when each protrusion 14*a* of the elastic member 14 is pressed by each solder ball 12*a*, each protrusion 14*a* is compressed. And by this compression, elastic deformation portion 14*c* of the protrusion 14*a* is pushed away and is deformed (displaced), as shown in FIG. 5, toward each escaping space 14*b*.

As a result, each protrusion 14*a* differs in the amount of deformation in accordance with the projection amount of the solder ball 12*a*. But the amount of deformation of each protrusion 14*a* can be absorbed into each escaping space 14*b* so that each protrusion 14*a* is to be deformed independently with different deformation amount without affecting the adjacent protrusion 14*a*.

Here, as shown in FIG. 5, deformation amount of protrusion 14*a* pressed by the solder ball 12*a*1 having small projection amount is smaller than the deformation amount of the protrusion 14*a* pressed by the solder ball 12*a* having larger projection amount than that of the solder ball 12*a*1. Thus, in between each protrusion 14*a* of the elastic member 14, an escaping space 14*b* is formed so that each protrusion 14*a* of the elastic member 14 can absorb variation of the projection amount of the solder ball 12*a* of the IC package 12 to be able to make contact between each solder ball 12*a* and the contact point 15*a*, thereby making uniform the contact pressure between each solder ball 12*a* and the contact point 15*a*.

And each protrusion 14*a* of the elastic member 14 is structured to be elastically deformed independently by the escaping space 14*b*. Therefore, even when the electrical connection between the solder ball 12*a* and the contact point 15*a* is to be consistently ensured, it is possible to reduce the pushing amount of the cover member 23 (pusher member 24) necessary for establishing contact between the solder ball 12*a*1 having small projection amount and the corresponding contact point 15*a* with a predetermined contacting pressure, compared to the conventional one, and also possible to reduce the operating force of the cover member 23. Moreover, excessive load will not be applied to the solder ball 12*a* having larger projection amount than the solder ball 12*a*1 thereby ensuring to prevent the solder ball 12*a* from being damaged or destroyed.

Second Embodiment

Figure 6:
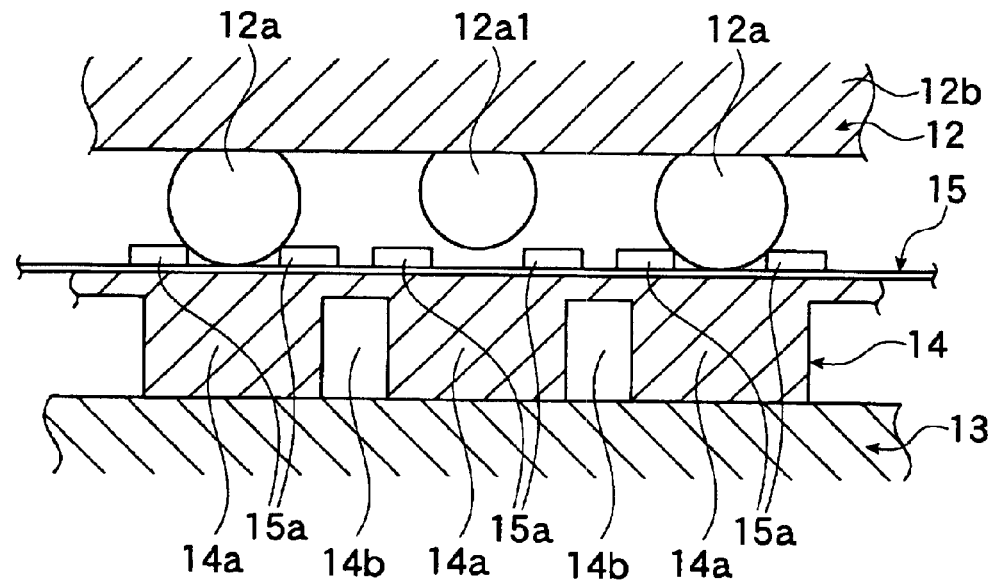
FIG. 6 is a sectional view showing a state of the solder ball of the IC package accommodated to the IC socket, before being pressed by the tab film, according to the second embodiment; an illustration of a stopper is omitted.
Figure 7:
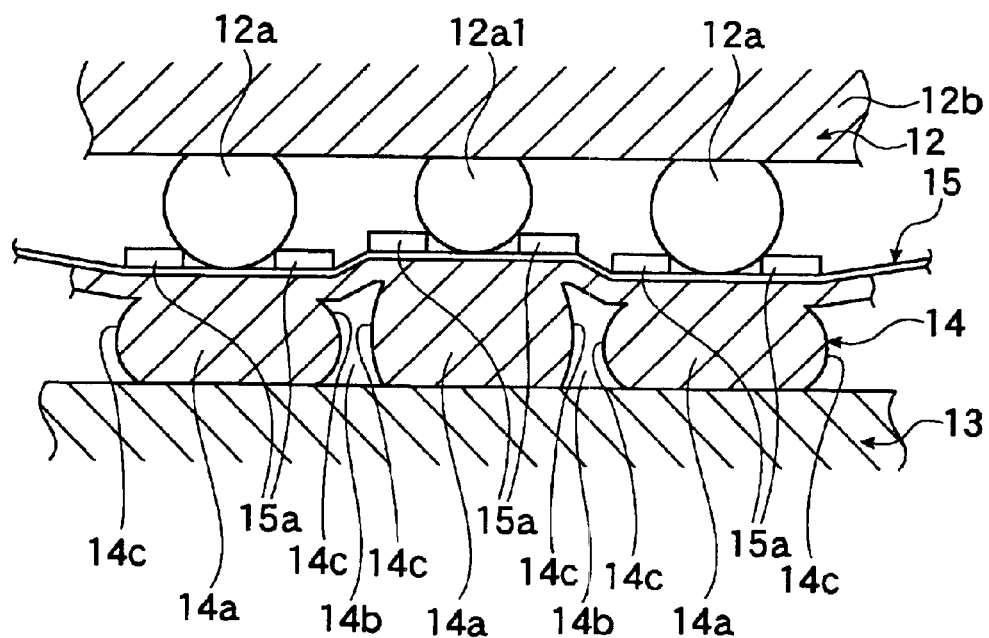
FIG. 7 is a sectional view showing a state of the solder ball of the IC package accommodated to the IC socket, being pressed by the tab film, according to the second embodiment; an illustration of a stopper is omitted.

FIG. 6 and FIG. 7 represent the second embodiment of the present invention.

In this second embodiment, the projecting direction of the protrusion portion 14*a* of the elastic member 14 is different from that of the first embodiment.

That is, protrusion 14*a* of the elastic member 14 is formed at a position corresponding to each solder ball 12*a* and the contact point 15*a* of the tab film 15 projecting downward toward the base plate 13 and in between each protrusion 14*a*, an escaping space 14*b* is formed.

In this manner, each protrusion 14*a* will be elastically deformed independently by the escaping space 14*b* without being affected by the other adjacent protrusion portion 14*a*, therefore, even in case where there is a variation in the amount of projection of the solder ball 12*a* of the IC package 12 and the IC package 12 having a solder ball 12*a*1 with a projection amount smaller than that of the other solder ball is attached, each protrusion 14*a* of the elastic member 14 will be elastically deformed independently in accordance with the projection amount of each corresponding solder ball 12*a*.

Accordingly, the protrusion 14*a* corresponding to the solder ball 12*a*1 having small projection amount, can be elastically deformed independently predetermined amount by the solder ball 12*a*1 without being affected by the elastic deformation amount of the adjacent protrusion 14*a*, thereby, establishing electrical connection between the solder ball 12*a*1 and the corresponding contact point 15*a* at a predetermined contacting pressure.

Structures and functions of this second embodiment other than those mentioned above are substantially the same as those of the first embodiment, so that details thereof are omitted herein.

Third Embodiment

Figure 8:
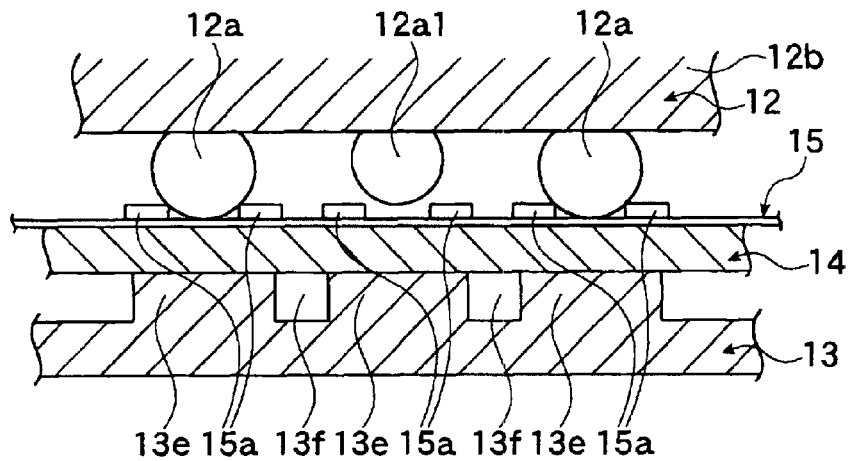
FIG. 8 is a sectional view showing a state of the solder ball of the IC package accommodated to the IC socket, before being pressed by the tab film, according to the third embodiment; an illustration of a stopper is omitted.
Figure 9:
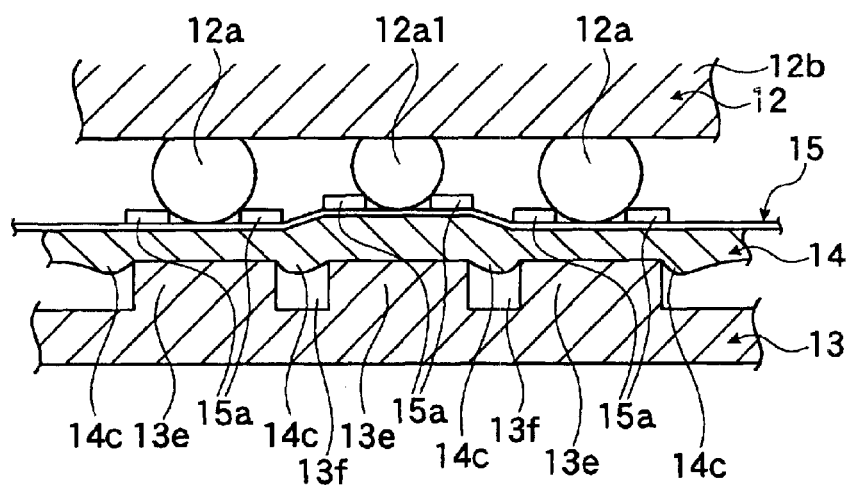
FIG. 9 is a sectional view showing a state of the solder ball of the IC package accommodated to the IC socket, being pressed by the tab film, according to the third embodiment; an illustration of a stopper is omitted.
Figure 10:
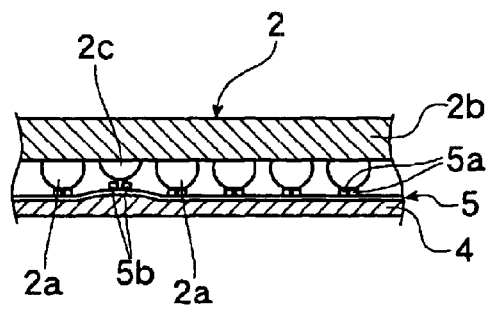
FIG. 10 is a sectional view showing a state of the solder ball of the IC package accommodated to the accommodation portion of an IC socket body of a conventional structure being pressed by the tab film.

FIG. 8 and FIG. 9 represent the third embodiment of the present invention.

In the third embodiment, the elastic member 14 is overall formed to have a uniform thickness, while, the base plate 13 is formed with a protrusion 13*e* projecting toward the elastic member 14 at a position corresponding to each contact point 15*a*, and in between each protrusion 13*e*, there is formed an escaping space 13*f*.

In such embodiment, when the elastic member 14 is pressed by the solder ball 12*a*, a portion corresponding to the contact point 15*a* of the elastic member 14 is compressed, and by this compression, the elastic deformation portion 14*c* is pushed away, and is displaced to the escaping space 13*f* placed in between the protrusion 13*e*, as shown in FIG. 9, so that each portion corresponding to each contact point 15*a* of the elastic member 14 can be compressed independently and respectively in proportion to the projection amount of the solder ball 12*a*.

Even in this structure, each portion corresponding to each contact point 15*a* of the elastic member 14 will be elastically deformed independently without being affected by the deformation of other portion adjacent thereof by the escaping space 13f. Therefore, as shown in FIG. 8 and FIG. 9, even in case where there is a variation in the projection amount of the solder ball 12a of the IC package 12 and the IC package 12 having solder ball 12a1 with smaller projection amount than that of the other solder ball is attached, each region of the elastic member 14 is elastically deformed independently in proportion to the projection amount of each corresponding solder ball 12a respectively.

In this, the region corresponding to the solder ball 12a1 having small projection amount will be elastically deformed the amount as prescribed by the solder ball 12a1 with out being affected by the elastic deformation amount of the adjacent region, thereby establishing electrical connection between the solder ball 12a1 and the corresponding contact point 15a1 at a predetermined contacting pressure.

Structures and functions of this third embodiment other than those mentioned above are substantially the same as those of the first embodiment, so that details thereof are omitted herein.

Although in the described embodiments, the present invention is applied to the IC socket 11 as "a socket for an electrical part", the present invention is also applicable to other devices or like.

Moreover, the present invention is applied to the IC socket 11 for IC package 12 of BGA (Ball Grid Array) type, but the present invention is not limited to such type, and is applicable to any type used for IC package having IC package terminal projecting downward from the lower surface of the package body and variation occurring in the amount of such projection. It is not limited to a terminal having a spherical shape, in particular.

What is claimed is:

1. A socket for an electrical part having a plurality of solder ball terminals projected from an under surface of a body of the electrical part, the socket comprising:
   a base member;
   an elastic member disposed on the base member; and
   a base plate, in the form of deformable sheet, disposed on the elastic member, and provided with a plurality of contact points to which the solder ball terminals of the electrical part are to be contacted, the contact points being disposed on an upper surface of the base plate in a predetermined distance to each other;
   a pressing mechanism mounted on the base plate, comprising
      a body having an opening portion at a central portion of the body through which the electrical part is inserted, and
      a cover member rotatably attached to the body, the cover member pressing the electrical part to establish electrical contact between the contact points and the solder ball terminals when the cover member is rotated toward the body; and
   an electrically insulating sheet stopper mounted on the base plate, the stopper having a predetermined thickness smaller than the height of the solder ball terminals and having a plurality of openings into which the solder ball terminals are inserted, wherein
      the stopper limits deformation of the solder ball terminals by making an upper surface of the stopper abut on the under surface of the body of the electrical part and a lower surface of the stopper abut on the upper surface of the base plate when the pressing mechanism presses the electrical part, and
      when portions of the elastic member corresponding to the contact points are compressed by the pressing force from the solder ball terminals of the electrical part, escaping spaces at positions in between the solder ball terminals provide for elastic deformation of the portions.

2. The socket for an electrical part according to claim 1, wherein the elastic member is formed with protrusions projecting toward the base plate at positions corresponding to the contact points, the escaping spaces being formed between the protrusions.

3. The socket for an electrical part according to claim 1, wherein the elastic member is formed with protrusions projecting toward the base member at positions corresponding to the contact points, the escaping spaces being formed between the protrusions.

4. The socket for an electrical part according to claim 1, wherein the base member is formed with protrusions projecting toward the elastic member at positions corresponding to the contact points, the escaping spaces being formed between the protrusions.

5. A socket for an electrical part having a plurality of solder ball terminals projected from an under surface of a body of the electrical part, the socket comprising:
   an elastic member; and
   a base plate in the form of deformable sheet and provided with contact points to which the solder ball terminals of the electrical part are to be contacted, the contact points being disposed on an upper surface of the base plate in a predetermined distance to each other;
   a pressing mechanism comprising
      a body having an opening portion at a central portion of the body through which the electrical part is inserted, and
      a cover member rotatably attached to the body, the cover member pressing the electrical part to establish electrical contact between the contact points and the solder ball terminals when the cover member is rotated toward the body; and
   an electrically insulating sheet stopper having a predetermined thickness smaller than the height of the solder ball terminals and having openings into which the solder ball terminals are inserted, wherein
      the stopper limits deformation of the solder ball terminals by making an upper surface of the stopper abut on the under surface of the body of the electrical part and a lower surface of the stopper abut on the upper surface of the base plate when the pressing mechanism presses the electrical part, and
      when portions of the elastic member corresponding to the contact points are compressed by a pressing force from the solder ball terminals due to the pressing by the pressing mechanism, escaping spaces at positions in between the solder ball terminals provide for elastic deformation of said portions of the elastic member.

6. The socket for an electrical part according to claim 5, wherein the elastic member is formed with protrusions projecting toward the base plate at positions corresponding to the contact points, the escaping spaces being formed between the protrusions, and said portions of the elastic member being part of the protrusions.

7. A socket for an electrical part having a plurality of solder ball terminals projected from an under surface of a body of the electrical part, the socket comprising:
   an elastic member;

an electrically insulating sheet stopper having a thickness smaller than the height of the solder ball terminals and having openings into which the solder ball terminals are inserted, a base plate between the elastic member and the stopper, the base plate being a deformable sheet and provided with contact points to which the solder ball terminals of the electrical part are to be contacted, the contact points being disposed on an upper surface of the base plate, the elastic member having portions corresponding to the contact points, wherein, when the electrical part is pressed to establish electrical contact between the contact points and the solder ball terminals, the stopper limits deformation of the solder ball terminals by making an upper surface of the stopper abut on the under surface of the body of the electrical part and a lower surface of the stopper abut on the upper surface of the base plate, and when the portions of the elastic member corresponding to the contact points are compressed by a pressing force from the solder ball terminals, escaping spaces at positions in between the solder ball terminals provide for elastic deformation of said portions of the elastic member, to thereby prevent damage to the solder ball terminals caused by the pressing force.

8. The socket for an electrical part according to claim 7, wherein the elastic member is formed with protrusions projecting toward the base plate at positions corresponding to the contact points, the escaping spaces being formed between the protrusions, and said portions of the elastic member being part of the protrusions.

9. A socket for an electrical part having solder ball terminals, the socket comprising:

an elastic member;

a stopper having a thickness smaller than the height of the solder ball terminals;

a base between the elastic member and the stopper and provided with contact points to which the solder ball terminals of the electrical part are to be contacted, the elastic member having portions corresponding to the contact points, wherein the elastic member, the stopper and the base are positioned with respect to each other so that, when the electrical part is pressed to establish electrical contact between the contact points and the solder ball terminals, the stopper limits deformation of the solder ball terminals due to the pressing of the electrical part by abutting an upper surface of the stopper on a surface of the electrical part and abutting a lower surface of the stopper on a surface of the base, and when the portions of the elastic member corresponding to the contact points are compressed by a pressing force from the solder ball terminals due to the pressing of the electrical part, escaping spaces between the solder ball terminals provide for elastic deformation of said portions of the elastic member, to thereby prevent damage to the solder ball terminals caused by the pressing force.

* * * * *